United States Patent
Hyun et al.

(10) Patent No.: US 10,989,779 B2
(45) Date of Patent: Apr. 27, 2021

(54) APPARATUS AND METHOD FOR RECONSTRUCTING MAGNETIC RESONANCE IMAGE USING LEARNING, AND UNDER-SAMPLING APPARATUS METHOD AND RECORDING MEDIUM THEREOF

(71) Applicant: YONSEI UNIVERSITY, UNIVERSITY - INDUSTRY FOUNDATION (UIF), Seoul (KR)

(72) Inventors: Chang Min Hyun, Seogwipo-si (KR); Jin Keun Seo, Seoul (KR); Hwa Pyung Kim, Seoul (KR); Sung Min Lee, Bucheon-si (KR); Sung Chul Lee, Seoul (KR)

(73) Assignee: YONSEI UNIVERSITY, UNIVERSITY - INDUSTRY FOUNDATION (UIF), Seoul (KR)

( * ) Notice: Subject to any disclaimer, the term of this patent is extended or adjusted under 35 U.S.C. 154(b) by 263 days.

(21) Appl. No.: 16/144,666

(22) Filed: Sep. 27, 2018

(65) Prior Publication Data
US 2019/0101605 A1   Apr. 4, 2019

(30) Foreign Application Priority Data

Sep. 29, 2017 (KR) .................. 10-2017-0127601
Sep. 14, 2018 (KR) .................. 10-2018-0110417

(51) Int. Cl.
*G01R 33/48* (2006.01)
*G01R 33/561* (2006.01)
(Continued)

(52) U.S. Cl.
CPC ..... *G01R 33/4818* (2013.01); *G01R 33/5608* (2013.01); *G01R 33/5611* (2013.01);
(Continued)

(58) Field of Classification Search
CPC ............ G01R 33/4816; G01R 33/4818; G01R 33/482; G01R 33/4822; G01R 33/4824;
(Continued)

(56) References Cited

U.S. PATENT DOCUMENTS

2015/0028872 A1   1/2015 Takeshima
2016/0109546 A1*  4/2016 Machii ............. G01R 33/56554
                                                      324/322
(Continued)

FOREIGN PATENT DOCUMENTS

CN   103679654   3/2014
JP     6073627   1/2017
(Continued)

OTHER PUBLICATIONS

Jo Schlemper et al., "A Deep Cascade of Convolutional Neural Networks for Dynamic MR Image Reconstruction", IEEE Transactions on Medical Imaging, vol. 37, No. 2, (Feb. 2018), pp. 491-503.

*Primary Examiner* — Tung X Nguyen
(74) *Attorney, Agent, or Firm* — Cantor Colburn LLP

(57) ABSTRACT

An under-sampling apparatus for MR image reconstruction by using machine learning and a method thereof, an MR image reconstruction device by using machine learning and a method thereof, and a recoding medium thereof are disclosed. The disclosed under-smapling apparatus includes: a setting portion that sets a region corresponding to a center of the k-space image as a first region and remaining regions as a second region; and an under-sampling portion that full-samples the first region and under-samples the second region, wherein in the under-sampling performed in the second region, lines are selected at regular intervals and then only the selected line is full-sampled. According to the (Continued)

under-sampling apparatus, a high-resolution MR image can be acquired while reducing imaing time.

21 Claims, 22 Drawing Sheets

(51) Int. Cl.
*G06T 7/00* (2017.01)
*G01R 33/56* (2006.01)

(52) U.S. Cl.
CPC .. *G06T 7/0014* (2013.01); *G06T 2207/20081* (2013.01); *G06T 2207/20084* (2013.01)

(58) Field of Classification Search
CPC ............ G01R 33/4826; G01R 33/4828; G01R 33/483; G01R 33/4831; G01R 33/4833; G01R 33/4835; G01R 33/4836; G01R 33/4838; G01R 33/50; G01R 33/543; G01R 33/5602; G01R 33/5604; G01R 33/5605; G01R 33/5607; G01R 33/5608; G01R 33/561; G01R 33/5611; G01R 33/5612; G01R 33/5613; G01R 33/5614; G01R 33/5615; G01R 33/5616; G01R 33/5617; G01R 33/5618; G01R 33/5619; G01R 33/563; G01R 33/56308; G01R 33/56316; G01R 33/56325; G01R 33/56333; G01R 33/56341; G01R 33/5635; G01R 33/56358; G01R 33/56366; G01R 33/56375; G01R 33/56383; G01R 33/56391; G01R 33/565; G01R 33/56509; G01R 33/56518; G01R 33/56527; G01R 33/56536; G01R 33/56545; G01R 33/56554; G01R 33/56563; G01R 33/56572; G01R 33/56581; G01R 33/5659; G01R 33/567; G01R 33/5673; G01R 33/5676

See application file for complete search history.

(56) References Cited

U.S. PATENT DOCUMENTS

2017/0131373 A1   5/2017   Takeshima et al.
2017/0146630 A1*  5/2017   Huang ............. G01R 33/56509
2018/0164395 A1*  6/2018   Setsompop ........ G01R 33/5613

FOREIGN PATENT DOCUMENTS

JP       2017086337     5/2017
KR   1020150039581     4/2015
KR   1020150125543   11/2015

\* cited by examiner

100 % k-space data          Reconstructed image

25 % k-space data    Reconstructed image

Image of resolution of 256x256
High-resolution image acquired by full-sampling

Image of resolution of 256x256
Distorted image due to under-sampling

Image of resolution of 256x256
Final reconstruction result

APPARATUS AND METHOD FOR RECONSTRUCTING MAGNETIC RESONANCE IMAGE USING LEARNING, AND UNDER-SAMPLING APPARATUS METHOD AND RECORDING MEDIUM THEREOF

CROSS-REFERENCE TO RELATED APPLICATION

This application claims priority to and the benefit of Korean Patent Application No. 10-2017-0127601 and 10-2018-0110417 filed in the Korean Intellectual Property Office on Sep. 29, 2017 and Sep. 14, 2018, the entire contents of which are incorporated herein by reference.

BACKGROUND OF THE INVENTION (a) Field of the Invention

The present invention relates to an under-sampling apparatus for magnetic resonance image reconstruction and a method thereof, and a magnetic resonance image reconstruction apparatus, a method, and a recording medium thereof. More particularly, the present invention relates to an under-sampling apparatus for reconstruction of a magnetic resonance image using machine learning and a method thereof, a magnetic resonance image reconstruction apparatus using learning and a method thereof, and a recording medium thereof.

(b) Description of the Related Art

Magnetic resonance imaging (MRI) provides cross-sectional images of human body with high spatial resolution in a relatively non-invasive way. However, data acquisition for an MRI takes a long time and involves confining a human being in an uncomfortable narrow bow. Shortening an MRI scan time might help increase patient satisfaction, reduce motion artifacts from patient movement, and reduce medical costs.

An MRI scan time is roughly proportional to the number of time-consuming phase-encoding steps in a k-space, where the k-space is a discrete Fourier transform of a magnetic resonance image.

Thus, many efforts have been made for an undersampled MRI, which skips phase-encoding lines in a k-space while eliminating aliasing, a serious consequence of the Nyquist criterion violation that is caused by skipping.

Conventionally, a compressed sensing method has been used to reconstruct such an under-sampled magnetic resonance image. According to the compressed sensing method, random-sampled data and a total variation minimization-based least squares method are used to reconstruct an image. However, the method has a fundamental disadvantage of erasing minute spatial changes of the image when reconstructing the image, and thus it is very difficult to apply the method in clinics because of the nature of the medical imaging field, which is the key of finding small variants (e.g., early stage cancer and the like) that are important in patient diagnosis.

Recently, a method that performs image reconstruction by using a deep learning network such as a convolutional neural network (CNN) has been suggested, and "A deep cascade of convolutional neural networks for MR image reconstruction", suggested by Jo Schlemper et al., is a prior art.

However, such conventional methods that reconstruct images by using a deep learning network perform image conversion by serially connecting CNNs, and the method also has a problem in effectively erasing an artifact that occurs in image reconstruction of a magnetic resonance image.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an under-sampling apparatus for reconstructing a magnetic resonance image by using mechanical learning, which can acquire a high-resolution reconstructed magnetic resonance image while reducing imaging time, and a method thereof, a magnetic resonance image reconstruction apparatus using mechanical learning and a method thereof, and a recording medium thereof.

A magnetic resonance image reconstruction apparatus using learning according to one aspect of the present invention includes: an under-sampling portion that performs full-sampling with respect to a first region that corresponds to a center of a first k-space image and performs under-sampling with respect to a second region in the first k-space image, excluding the first k-space image, to under-sample the first k-space image; and a magnetic resonance image reconstruction portion that outputs a magnetic resonance image based on the first k-space image through a pre-learned neural network, generates a third k-space image by correcting a second k-space image that is based on the output magnetic resonance image, based on the first k-space image with respect to a region that correspondings to the first k-space image in the second k-space, and acquires a magnetic resonance image based on the third k-space image.

The MR image reconstruction portion may include: a first image converter that acquires a first MR image by converting the first k-space image; a first image reconstruction portion that acquires a second MR image through the learned neural network by receiving the first MR image; a second image converter that acquires the second k-space image by converting the second MR image; a second image reconstruction portion that generates the third k-space image through correction that replaces a portion overlapping the first k-space image with the first k-space image in the second k-space image; and a third image converter that acquires a reconstructed MR image by converting the third k-space image.

The first image converter and the third image converter may use inverse Fourier transform, and the second image converter may use Fourier transform. The first image reconstruction portion may be pre-learned by using a reference MR image converted from a k-space image that corresponds to a MR image and in which full-sampling is performed on a center region of the k-space image and under-sampling is formed on a remaining region of the k-space image as an input value, and a MR image converted from a reference full-sample k-space image as a label.

The first region may be set to a region corresponding to 3% to 8% of a center of the first k-space image.

The under-sampling performed on the second region may perform encoding by selecting one per at least four lines.

The MR image reconstruction apparatus may further include a region setting portion that sets a region that corresponds to a center of the first k-space image as the first region, and a remaining region as the second region.

An MR image reconstruction apparatus using learning according to another aspect of the present invention includes: a decomposition portion that generates n×k1 low-resolution input images by applying k1 first filters n times to a high-resolution input image; a learning portion that generates n×k2 low-resolution output images by applying a corresponding neural network according to the n×k1 low-resolution input images; and a reconstruction portion that generates a high-resolution output image by applying k2 second dual filters n times to the n×k2 low-resolution output images, wherein the high-resolution input image is generated by converting a k-space image where full-sampling is performed on a first region that corresponds to a center of the k-space image and under-sampling is performed on a second region in the k-space image, excluding the first region, and the k2 second dual filters are dual filters with respect to k2 second filters that generate a reference high-resolution label image for learning of the neural network as n×k2 low-resolution label images. Here, n can be any positive integer.

The learning portion may include a neural network is learned so that a result acquired by performing deep learning on n×k1 reference low-resolution input images that are generated by iteratively performing the k1 filters n times on a reference high-resolution input image, becomes n×k2 reference low-resolution label images, and the n×k2 reference low-resolution label images may be generated by repeating the k2 filters n times on a high-resolution label image.

The learning portion may use different neural networks. For example, two neural networks can be used. The first neural network learns the relation between low-resolution input images and the first low-resolution output image produced by low pass filtering. The second one learns the relation between low-resolution input images and the other low-resolution output images.

An MR image reconstruction method using machine learning according to another aspect of the present invention includes: under-sampling a first k-space image by full-sampling a first region that corresponds to a center of the first k-space image and under-sampling a second region, excluding the first region, in the first k-space image; outputting an MR image based on the first k-space image through a pre-learned neural network; generating a third k-space image by correcting a second k-space image that is based on the output MR image, based on the first k-space image with respect to a region corresponding to the first k-space image in the second k-space image; and acquiring an MR image based on the third k-space image.

The outputting the MR image based on the first k-space image through the pre-learned neural network may include: acquiring a first MR image by converting the first k-space image; and acquiring a second MR image through the learned neural network by receiving the first MR image.

The acquiring the first MR image may include acquiring the first MR image by inverse Fourier transforming the first k-space image.

The generating the third k-space image may include: acquiring the second k-space image by converting the output MR image; and generating the third k-space image through correction that replaces a portion overlapping the first k-space image with the first k-space image in the second k-space image.

The acquiring the second k-space image may include acquiring the second k-space image by Fourier transforming the output MR image.

The pre-learned neural network may be pre-learned by using a reference MR image converted from a k-space image that corresponds to an MR image and in which full-sampling is performed on a center region of the k-space image and under-sampling is formed on a remaining region of the k-space image as an input value, and an MR image converted from a reference full-sample k-space image as a label.

The MR image reconstruction method using mahine learning may further include setting a region corresponding to a center of the first k-space image as the first region and a remaining region as the second region.

An MR image reconstruction method using machine learning according to another aspect of the present invention includes: generating a high-resolution input image by converting a k-space image where full-sampling is performed on a first region that corresponds to a center of the k-space image and under-sampling is performed on a second region in the k-space image, excluding the first region; decomposing for generating n×k1 low-resolution input images by applying k1 first filters n times on the high-resolution input image; generating n×k2 low-resolution output images by applying a corresponding neural network according to the n×k1 low-resolution input images; and generating a high-resolution output image by applying n×k2 second dual filters n times to the n×k2 low-resolution output images, wherein the k2 second dual filters are dual filters with respect to k2 second filters that generate a reference high-resolution label image for learning of the neural network as n×k2 low-resolution label images.

The neural network may be learned so that a result acquired by performing deep learning on n×k1 reference low-resolution input images that are generated by iteratively performing the k1 filters n times on a reference high-resolution input image, becomes n×k2 reference low-resolution label images, and the n×k2 reference low-resolution label images may be generated by repeating the k2 filters n times on a high-resolution label image.

The generating the n×k2 low-resolution output images may include: applying a first neural network that corresponds to a first low-resolution input image among the n×k1 low-resolution input images; and applying a second neural network that corresponds to a second low-resolution input image among the n×k1 low-resolution input images.

In a recording medium according to another aspect of the present invention, a program that performs the above-described MR image reconstruction method using machine learning can be recorded.

The present invention is advantageous in that a high quality reconstructed MR image can be acquired while reducing imaging time.

DETAILED DESCRIPTION OF THE EMBODIMENTS

Figure 1A:
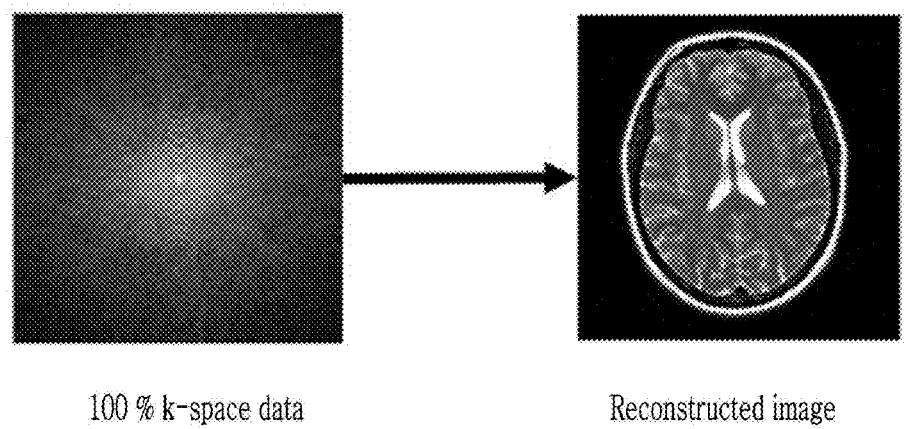
FIG. 1A and FIG. 1B exemplarily show an MR image that is converted according to an acquired k-space image.

The present invention may have various modifications and various exemplary embodiments, and specific exemplary embodiments will be illustrated in the drawings and described in detail. However, this does not limit the present invention to specific exemplary embodiments, and it should be understood that the present invention covers all modifications, equivalents, and replacements included within the idea and technical scope of the present invention. Like reference numerals designate like elements in the descriptions related to the respective drawings.

It will be understood that, although the terms first, second, etc. may be used herein to describe various elements, these elements should not be limited by these terms. These terms are only used to distinguish one element from another. For example, the first structural component may be called the second structural component, and similarly, the second structural component may be called the first structural component. Hereinafter, exemplary embodiments of the present invention will be described in detail with reference to the accompanying drawings.

An MRI acquires a k-space image through imaging, and acquires an MR image by converting the k-space image.

FIG. 1 exemplarily shows an MR image that is converted according to an acquired k-space image.

Referring to FIG. 1A, an accurate MR image can be acquired by converting a full-sampled k-space image, but full-sampling of k-space image requires too much data acquisition time.

Figure 1B:
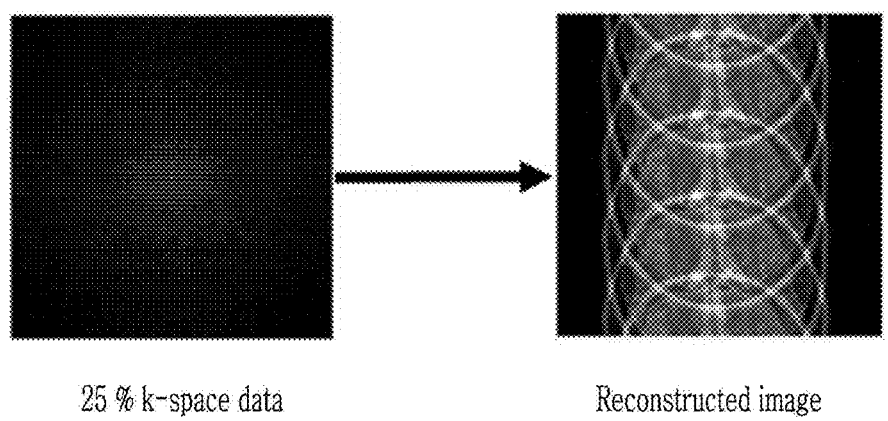

Meanwhile, referring to FIG. 1B, an under-sampled k-space image is used to reduce an k-space image acquisition time, and in this case, a converted MR image becomes aliased.

Thus, a reconstruction process is required to produce MR images with a quality that is as high as a regular MR image reconstructed from fully sampled k-space data, when an under-sampled k-space image is used to reduce imaging time.

According to an exemplary embodiment of the present invention, under-sampling is performed at regular intervals, and this is shown in FIG. 1. For example, when one line per four lines is selected as shown in FIG. 1B, information of a four-folded image can be acquired. In the exemplary embodiment, image reconstruction is performed by learning the folded image information and information of an unfolded blurred image corresponding to a fully sampled first region (low frequency part in a k-space), which is acquired at 3% to 8% of the center of the image.

The present invention discloses under-sampling and MR image reconstruction, which can acquire an accurate MR image by using an under-sampled k-space image.

Figure 2:
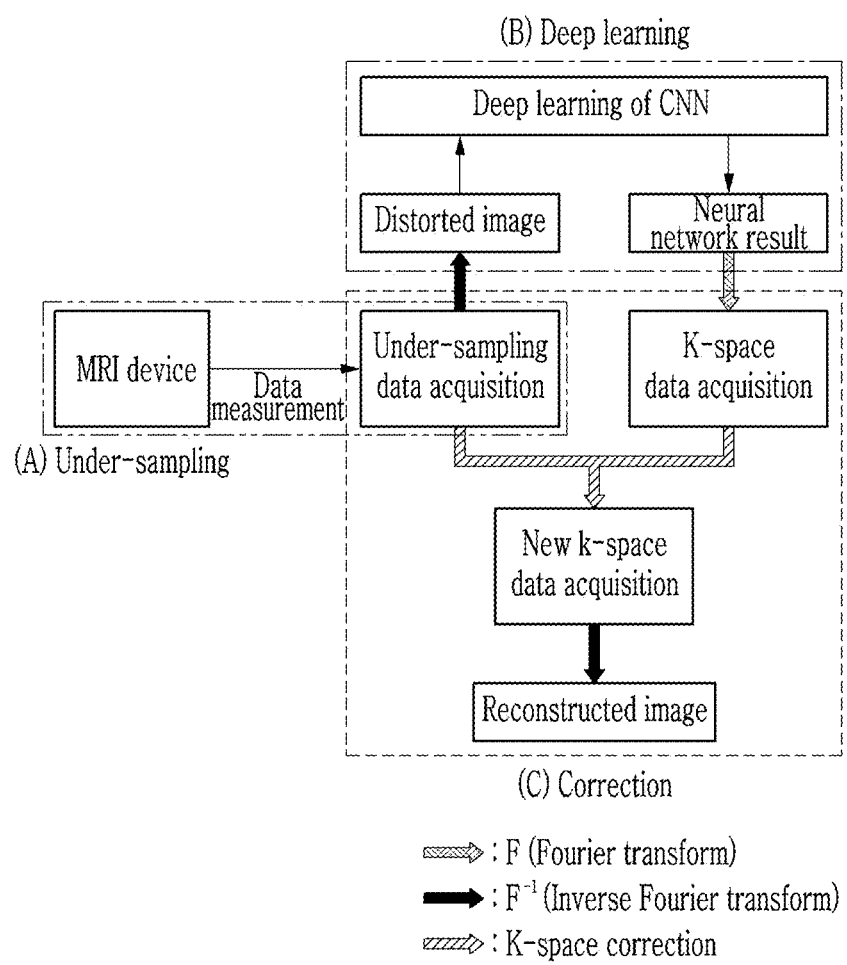
FIG. 2 is provided to describe an under-sampling and MR image reconstruction process according to a preferable exemplary embodiment of the present invention.

For example, according to the exemplary embodiment of the present invention, deep learning of a convolutional neural network is used to reconstruct a desired image by using an under-sampled k-space image. A deformed image acquired from under-sampled data is input to the convolutional neural network and the convolutional neural network is learned to output an original MR image, which can be acquired from full-sampled data. In the exemplary embodiment, in addition to uniform sampling, data at a low-frequency region is additionally measured and added to the data to effectively acquire the original image, and the convolutional neural network is learned by using a deformed image acquired from the data. FIG. 2 is provided to describe an under-sampling and an MR image reconstruction process according to a preferable exemplary embodiment of the present invention.

Referring to FIG. 2, a reconstructed MR image can be acquired through (A) an under-sampling process, (B) a deep-learning process, and (C) a correction process.

In the (A) under-sampling process, full-sampling is carried out with respect to a first region and under-sampling is carried out with respect to a second region such that a first k-space image S can be acquired.

The full-sampling implies encoding 100% of the entire regions of the k-space image, and the under-sampling implies encoding of a part of the k-space image. For example, the under-sampling can be carried out by encoding only one line per four lines in a phase encoding direction in the k-space image. In this case, lines may be selected at regular intervals. That is, when one line is encoded, the next three lines are skipped and the fourth line is selected to be encoded, thereby carrying out the under-sampling.

The k-space image can be deformed to an MR image by using an inverse Fourier transform, and the MR image can be converted to the k-space image by using a Fourier transform.

In the (B) deep learning process, the MR image that is inverse Fourier transformed from the first k-space image S is output as a first MR image through a learned neural network. The learned neural network may be a convolutional neural network, and the convolutional neural network may be pre-learned by using the MR image that is converted in a reference first k-space image as an input value and using an MR image converted from a reference full-sampled k-space image as a label. The learned neural network of the exemplary embodiment of the present invention is not limited to the convolutional neural network, and another neural network that can provide the same function and effect is applicable.

In the (C) correction process, the first MR image acquired in the (B) deep learning process is converted to a second k-space image, and the second k-space image is corrected based on the first k-space image S to acquire a third k-space image with respect to a region corresponding to the first k-space image S in the second k-space image. Next, the third k-space image is converted by performing an inverse Fourier transform to thereby acquire a reconstructed second MR image.

Next, a structure of an under-sampling apparatus for reconstructing an MR image by using machine learning according to an exemplary embodiment of the present invention will be described in detail.

Figure 3:
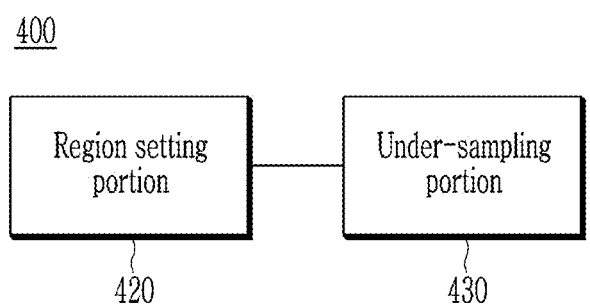
FIG. 3 is a configuration diagram of an under-sampling apparatus for MR image reconstruction by using machine learning according to an exemplary embodiment of the present invention.

FIG. 3 is a configuration diagram of an under-sampling apparatus for MR image reconstruction by using machine learning according to an exemplary embodiment of the present invention.

Referring to FIG. 3, an under-sampling apparatus 400 for MR image reconstruction by using machine learning according to the exemplary embodiment of the present invention may include a region setting portion 420 and an under-sampling portion 430.

The under-sampling apparatus 400 acquires a k-space image through MR image imaging. It takes a lot of time for imaging, which may increase the cost of imaging and cause side effects such as claustrophobia in order to acquire the k-space image by full sampling. Thus, the under-sampling apparatus 400 may operate to reconstruct an accurate MR image by only using an under-sampled k-space image.

The region setting portion 420 sets a region that corresponds to the center of a first k-space image to be acquired as a first region and a remaining region as a second region.

For example, the first region may be set to be a region that corresponds to 3% to 8% of the center of the k-space image, and the remaining region may be set as the second region.

When an MR image that is converted from a uniformly under-sampled k-space image with respect to the entire region is used in the learning process, a separability condition cannot be satisfied and thus it is not possible to perform learning for correcting the converted MR image, because location information becomes lost. Thus, according to the exemplary embodiment of the present invention, under-sampling is performed with respect to the second region, but the first region, which corresponds to the center portion, is full-sampled to thereby reconstruct an MR image.

The under-sampling portion 430 performs full-sampling with respect to the first region, and may perform under-sampling with respect to the second region. Here, the full-sampling implies encoding 100% the entire region of the k-space image, and the under-sampling implies encoding a part of the k-space image. For example, the under-sampling portion 430 may perform under-sampling by encoding only one line selected per four lines in the k-space image. In this case, lines may be selected at regular intervals. That is, when one line is encoded, the next three lines are skipped and the fourth line is selected to be encoded, thereby performing under-sampling.

For example, the under-sampling portion 430 may perform under-sampling as shown in FIG. 1 (b) with respect to the second region, and may perform full-sampling with respect to the first region, which corresponds to the center portion. Resultantly, the under-sampling portion 430 may perform under-sampling that can encode a total of about 27% to about 37%, including the first region and the second region.

FIG. 4 exemplarily shows a comparison between a full-sampled k-space image, an under-sampled k-space image, and a first k-space image, and FIG. 5 exemplarily shows MR images that are respectively converted from the full-sampled k-space image, the under-sampled k-space image, and the first k-space image.

Figure 4A:
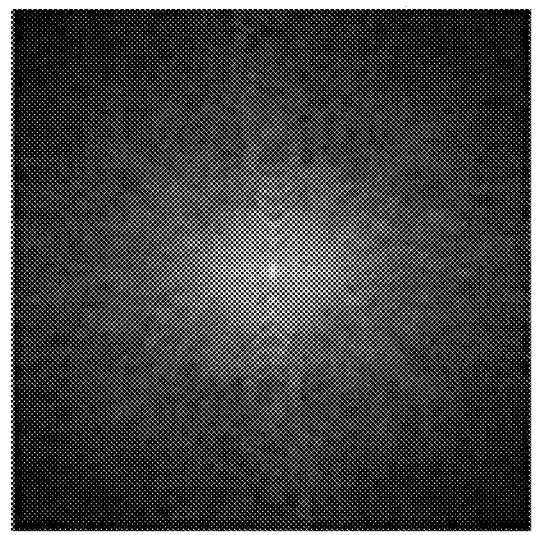
FIG. 4A to FIG. 4C exemplarily show a comparison between a full-sampled k-space image, an under-sampled k-space image, and a first k-space image.
Figure 4B:
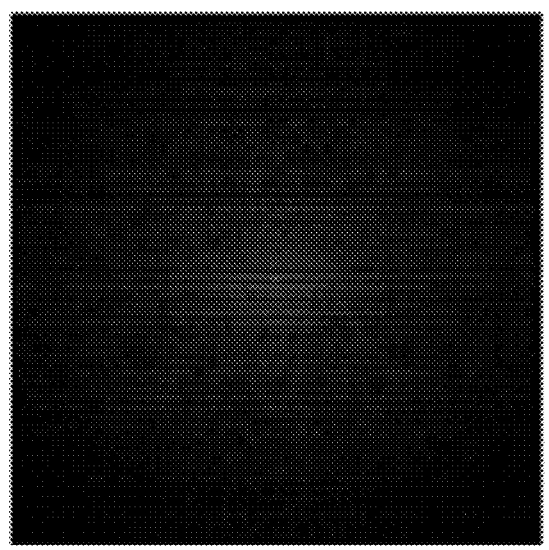
Figure 4C:
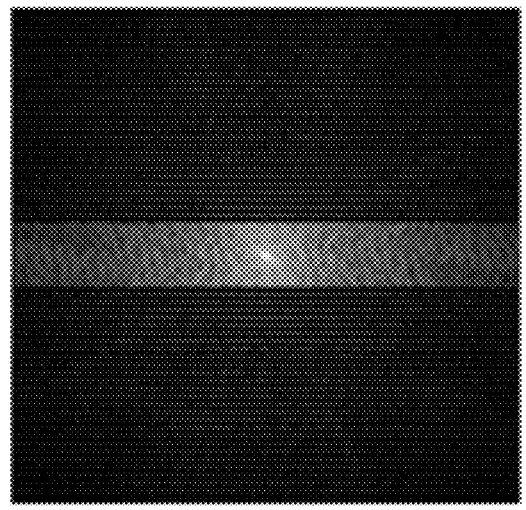
Figure 5A:
FIG. 5A to FIG. 5C exemplarily show MR images, respectively converted from the full-sampled k-space image, the under-sampled k-space image, and the first k-space image.
Figure 5B:
Figure 5C:

In FIG. 4A is the full-sampled k-space image, FIG. 4B is the under-sampled k-space image, and FIG. 4C is the first k-space image. FIG. 5A, FIG. 5B, and FIG. 5C are MR images respectively converted from FIG. 4A, FIG. 4B, and FIG. 4C.

Referring to FIG. 4 and FIG. 5, FIG. 5B includes features of an image, but it is difficult to precisely determine a location of important information such as cancer cell information marked by the arrow in the drawing. Meanwhile, FIG. 5C includes features of the image and also enables precise determination of a location of important information such as cancer cell information marked by the arrow in the drawing.

Hereinafter, a structure of an MR image reconstruction apparatus using machine learning according to a preferable exemplary embodiment of the present invention will be described in detail.

Figure 6:
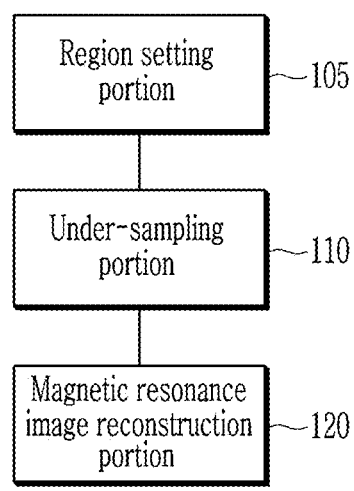
FIG. 6 is a configuration diagram of an MR image reconstruction apparatus using machine learning according to a preferable exemplary embodiment of the present invention.

FIG. 6 is a configuration diagram of an MR image reconstruction apparatus using machine learning according to a preferable exemplary embodiment of the present invention.

Referring to FIG. 6, an MR image reconstruction apparatus according to the preferable exemplary embodiment of the present invention may include a region setting portion 105, an under-sampling portion 110, and a MR image reconstruction portion 120.

The region setting portion 105 and the under-sampling portion 110 may be the same as the region setting portion 420 and the under-sampling portion 430 of the above-described under-sampling apparatus 400. The under-sampling portion 110 may under-sample a first k-space image.

The MR image reconstruction portion 120 acquires an MR image that is reconstructed by using the first k-space image.

Figure 7:
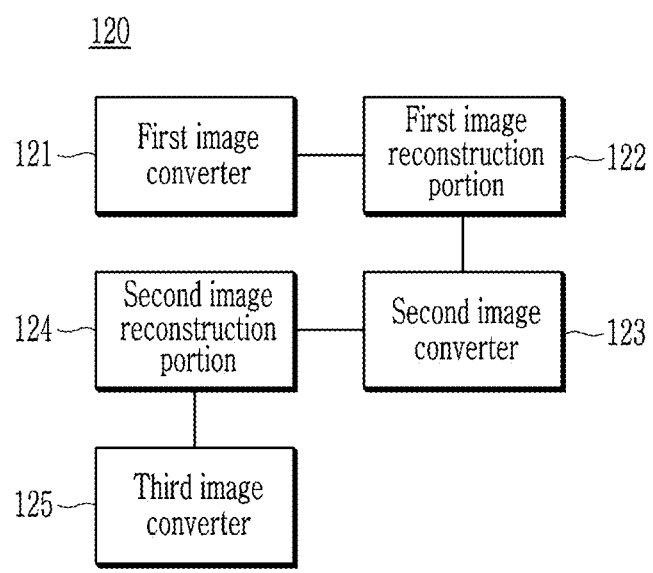
FIG. 7 is a detailed configuration diagram of the MR image reconstruction portion of the present exemplary embodiment.
Figure 8:
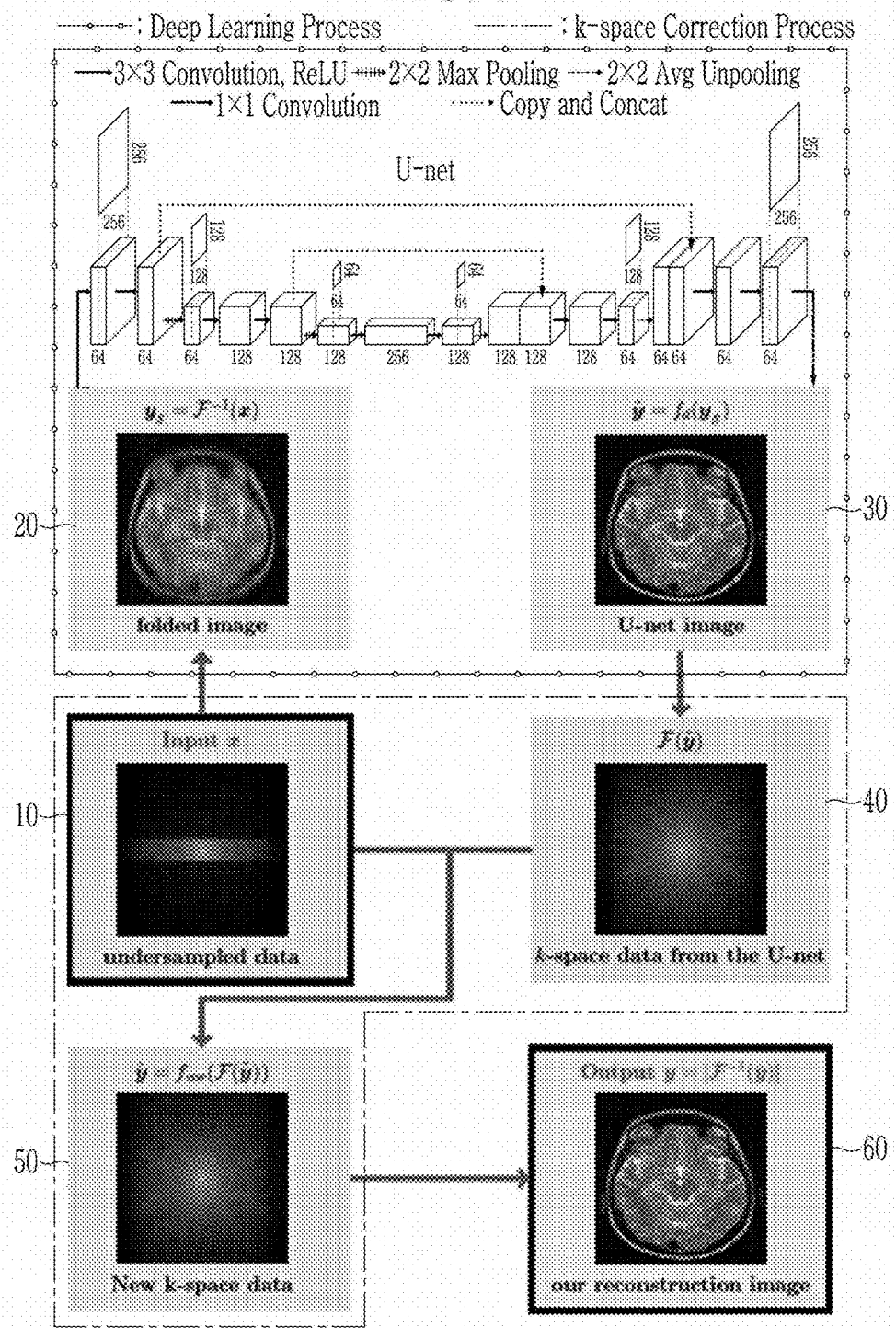
FIG. 8 is provided for description of a process for acquiring the reconstructed MR image of the MR image reconstruction portion.

FIG. 7 is a detailed configuration diagram of the MR image reconstruction portion of the present exemplary embodiment, and FIG. 8 is provided for description of a process for acquiring the reconstructed MR image of the MR image reconstruction portion.

Referring to FIG. 7, the MR image reconstruction portion 120 may include a first image converter 121, a first image reconstruction portion 122, a second image converter 123, a second image reconstruction portion 124, and a third image converter 125.

Referring to FIG. 7 and FIG. 8, the first image converter 121 can acquire a first MR image 20 by performing an inverse Fourier transform on a first k-space image 10, and the first image reconstruction portion 122 can acquire a second MR image 30 by receiving the first MR image 20. The first image reconstruction portion 122 uses a convolutional neural network, and the convolutional neural network may be pre-learned by using the MR image that is converted in a reference first k-space image as an input value and using an MR image that is converted from a reference full-sampled k-space image as a label.

In addition, the second image converter 123 can acquire a second k-space image 40 by Fourier-transforming the second MR imagb 30, and the second image reconstruction portion 124 can acquire a third k-space image 50 by correcting the second k-space image 40 based on the first k-space image 10 with respect to a region that corresponds to the first k-space image 10 in the second k-space image 40.

Then, the third image converter 125 can acquire an MR image 60 that is reconstructed by converting the third k-space image 50.

Next, each constituent element of the MR image reconstruction portion 120 will be described in further detail.

The first image converter 121 acquires the first MR image 20 by converting the first k-space image 10. The first k-space image 10 is converted to the first MR image 20 by performing an inverse Fourier transform.

The first image reconstruction portion 122 receives the first MR image 20 and acquires the second MR image 30. The first image reconstruction portion 122 can acquire the second MR image 30 by using a learned neural network.

For learning, a deep learning algorithm may be used in the present exemplary embodiment, and as an exemplary embodiment, a convolutional neural network (CNN) algorithm is used. A convolutional neural network is a model that simulates a person's brain function based on the assumption that when a person recognizes an object, it extracts basic features of the object and then performs complex calculations in the brain and recognizes the object based on the result of the complex calculations, and recently, it has been widely used in image recognition and speech recognition. In the convolutional neural network, various filters are used for extraction of features of an image basically through a convolution (Conv.) operation, and a pooling or non-linear activation function is also used to add non-linear features.

Hereinafter, the CNN algorithm will be briefly described, and then exemplary embodiments of the present invention will be described in detail with reference to the accompanying drawings.

Figure 9:
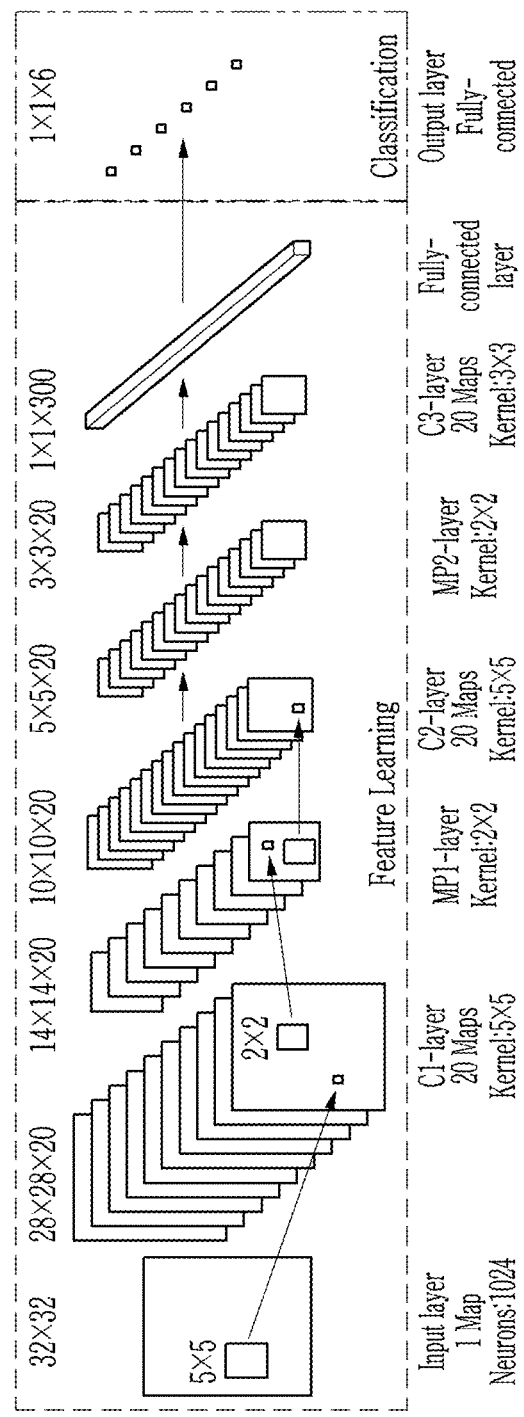
FIG. 9 is provided for description of the CNN algorithm.
Figure 10:
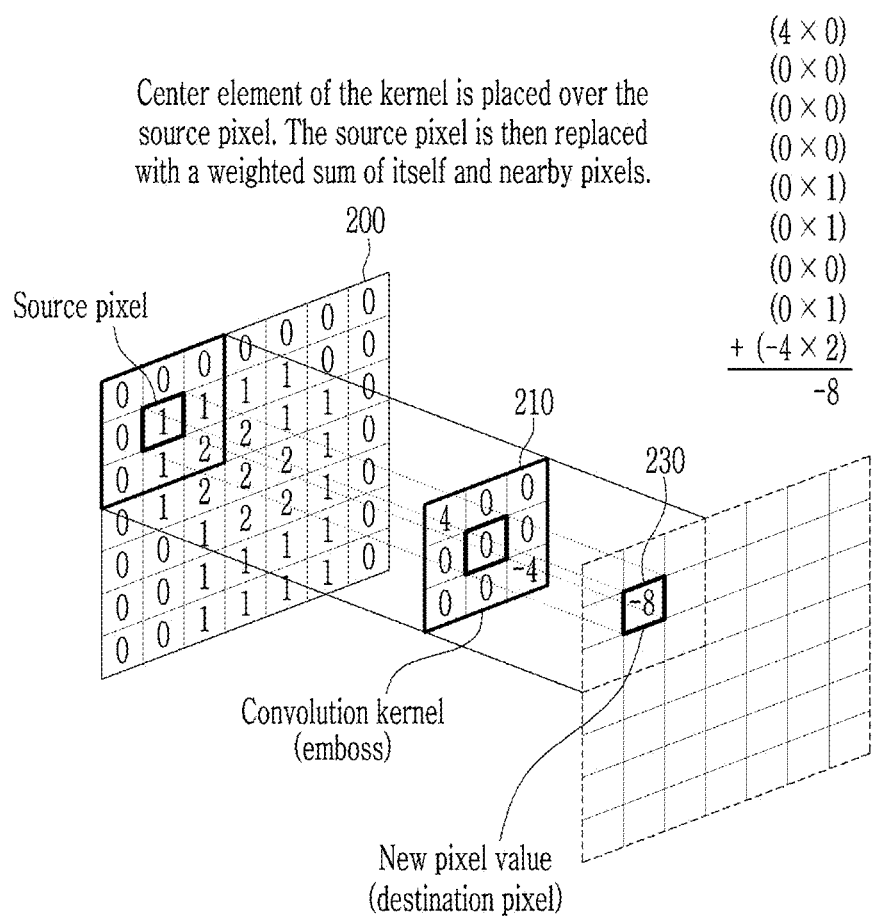
FIG. 10 is provided for description of a convolution method of the convolutional neural network.
Figure 11:
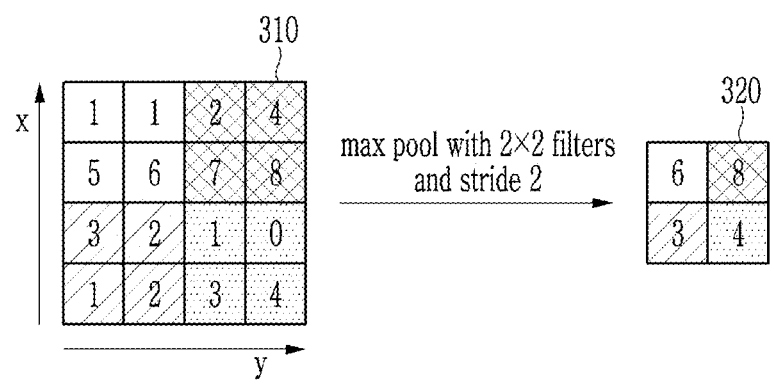
FIG. 11 is provided for description of a down-sampling method of the convolutional neural network.

FIG. 9 is provided for description of the CNN algorithm. FIG. 10 is provided for description of a convolution method of the convolutional neural network, and FIG. 11 is provided for description of a down-sampling method of the convolutional neural network.

Referring to FIG. 9, according to the CNN algorithm, feature learning with respect to a feature map of an input image is performed through convolution and down-sampling with respect to the input image, and then the input image is identified or classified through the feature map. The feature map includes feature information with respect to the input image. For feature learning of the feature map, convolutions C1, C2, and C3 and down-samplings MP1 and MP2 are iteratively performed, and the number of iterations may be variously determined depending on exemplary embodiments.

Referring to FIG. 9 and FIG. 10, when the size of a filter (or kernel) 210 used in the convolution is determined, the convolution is carried out through a weighted sum of a weight allocated to each pixel of the filter and a product between pixel values of an input image 200. That is, the pixel valve between pixels corresponding to a specific region of the input image, overlapped by the filter, is multiplied by the weight of the filter, and then values of all the products of the filter-overlapped region are added such that a pixel value 230 of a convolution layer can be determined.

As shown in FIG. 10, summing is performed on a result of products between weight values 4, 0, 0, 0, 0, 0, 0, 0, and −4 of the filter 210 and pixel values 0, 0, 0, 0, 1, 1, 0, 1, and 2 of an overlapped specific region of the input image 200 per corresponding pixels, and thus the final value of −8 is determined as the pixel value 230. The filter vertically and horizontally moves and summing of weights of a total of 9 pixels with respect to an overlapped region of the input image is performed, and for example, a 5×5 convolution layer may be generated when the size of the input image 200 is 7×7 and the size of the filter 210 is 3×3.

Since pixel values according to the convolutions become the pixel value 230 of the center pixel in the overlapped region, the convolution layer with respect to the input image, that is, the size of the convoluted image, is reduced. However, when an outer edge region of the input image is padded with a specific pixel value, a 7×7 convolution layer, which is the same size as the input image, can be generated. The number of convolution layers is determined according to the number of filters.

In FIG. 9 and FIG. 11, down-sampling is performed to reduce the size of the convolution layer, that is, the resolution, and max-pooling is widely used as a method for down-sampling. The maximum value among pixel values of a convolution layer included in a kernel, which is used in the down-sampling, is taken such that a max-pooling layer that is smaller than the convolution layer in size can be generated.

For example, when a 2×2 kernel is applied to a 4×4 convolution layer 310, 6, 8, 3, and 4 are determined as maximum values per each of 2×2 regions, which are displayed by different colors, such that a max-pooling layer 320 can be generated.

Referring back to FIG. 9, the feature map is input to a fully-connected neural network, and learning with respect to a parameter of the convolutional neural network is performed according to a difference between a label with respect to a pre-given full-sampled input image and an output value of the neural network.

As described, the first image reconstruction portion 122 may be pre-learned by using a reference first MR image generated from a first k-space image in advance as an input value and an MR image generated from a reference full-sampled k-space image as a label.

A second image converter 123 can acquire a second k-space image 40 by converting a second MR image 30. The second k-space image 40 is acquired for the next correction. Fourier transform may be used in the conversion.

A second image reconstruction portion 124 may generate a fourth k-space image 50 by correcting the second k-space image 40 using the first k-space image 10. Since the second MR image 30 is acquired from a first MR image 20 by learning, information of the first k-space image 10, existing in the second k-space image 40, which is converted from the second MR image 30, may be partially deformed. Thus, the second image reconstruction portion 124 may generate the third k-space image 50 through correction that replaces a portion of the second k-space image 40, which is overlapped with the first k-space image 10, with the first k-space image 10.

Then, a third image converter 125 may acquire an MR image 60 that is reconstructed by converting the third k-space image 50. Inverse Fourier transform may be used in the conversion.

As described above, according to the present invention, full-sampling is performed in the first region and under-sampling is performed in the second region and thus a k-space image is under-sampled, and thus it is possible to acquire a more accurately reconstructed MR image even within a shorter imaging time of the MR image.

Figure 12:
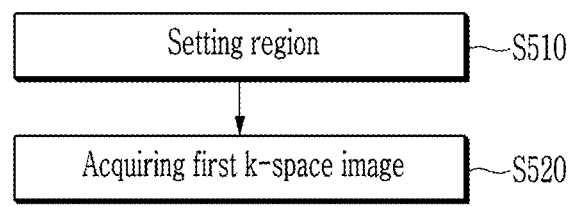
FIG. 12 is a time-based flowchart of an under-sampling method for MR image reconstruction by using machine learning according to a preferable exemplary embodiment of the present invention.

FIG. 12 is a time-based flowchart of an under-sampling method for MR image reconstruction by using machine learning according to a preferable exemplary embodiment of the present invention.

Referring to FIG. 12, an under-sampling method for MR image reconstruction by using machine learning according to a preferable exemplary embodiment of the present invention may include setting regions (S510) and acquiring a first k-space image (S520).

In the setting of regions (S510), a region setting portion 420 sets a first region and a second region.

In the acquiring of the first k-space image (S520), an under-sampling portion 430 performs under-sampling to acquire the first k-space image.

Figure 13:
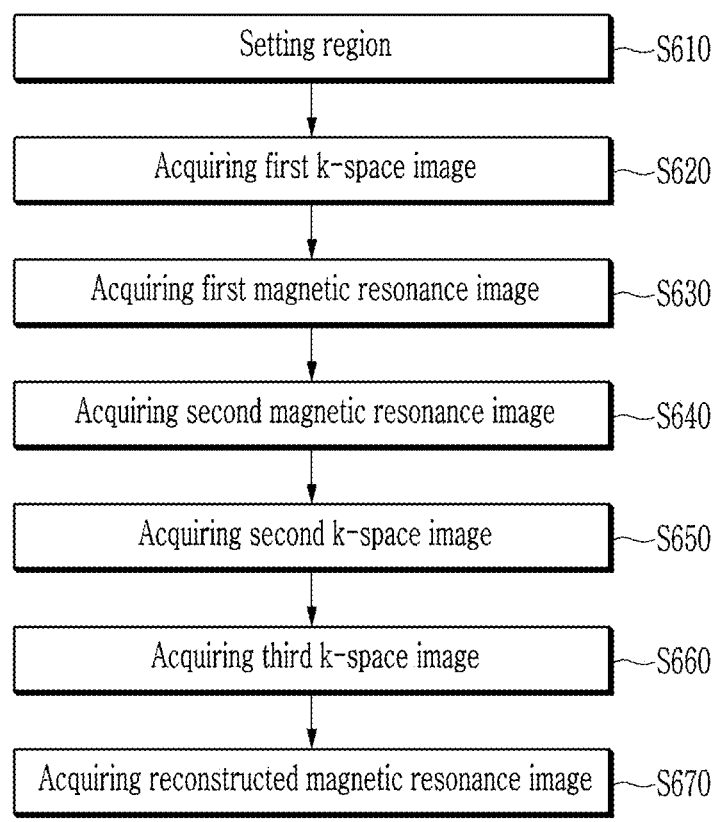
FIG. 13 is a time-based flowchart of a method for MR image reconstruction by using mahine learning according to a preferable exemplary embodiment of the present invention.

FIG. 13 is a time-based flowchart of a method for MR image reconstruction by using machine learning according to a preferable exemplary embodiment of the present invention.

Referring to FIG. 13, a method for MR image reconstruction by using machine learning according to a preferable exemplary embodiment of the present invention may include setting regions (S610), acquiring a first k-space image (S620), acquiring a first MR image (S630), acquiring a second MR image (S640), acquiring a second k-space image (S650), acquiring a third k-space image (S660), and acquiring a reconstructed MR image (S670).

The setting the regions (S610) and the acquiring the first k-space image (S630) may be performed in the same way as the setting the regions (S510) and the acquiring the first k-space image (S520) in the above-described under-sampling method for MR image reconstruction by using learning.

The acquiring the first MR image (S630) is a step for acquiring a first MR image 20 by converting a first k-space image 10 by a first image converter 121.

The acquiring the second MR image (S640) is a step for acquiring a second MR image 30 by receiving the first MR image 20 and using a learned neural network.

The acquiring the second k-space image (S650) is a step for acquiring a second k-space image 40 by converting the second MR image 30 in a second image converter 123.

The acquiring the third k-space image (S660) is a step for acquiring a third k-space image 50 by correcting the second k-space image 40 based on the first k-space image 10 with respect to a region corresponding to the first k-space image 10 in a second image reconstruction portion 124.

The acquiring the reconstructed MR image (S670) is a step for acquiring an MR image 60 that is finally reconstructed by converting the third k-space image 50 in a third image converter 125.

FIG. 14 exemplarily shows a comparison between MR images generated according to the exemplary embodiments of the present invention.

Figure 14A:
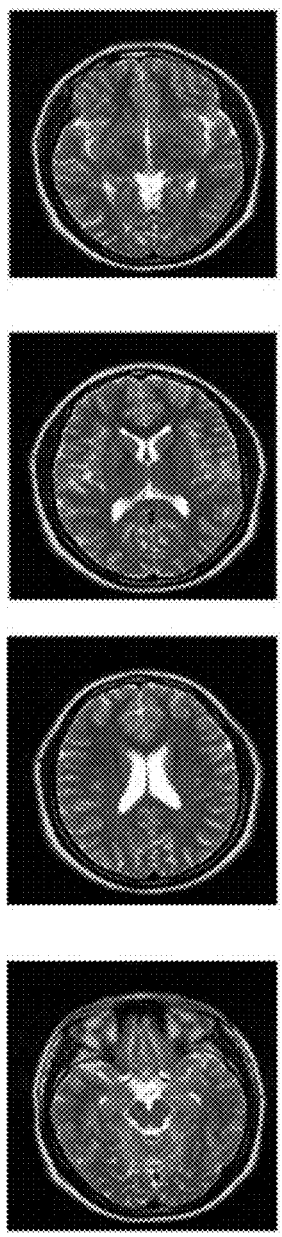
FIG. 14A to FIG. 14C exemplarily show a comparison between MR images generated according to the exemplary embodiments of the present invention.
Figure 14B:
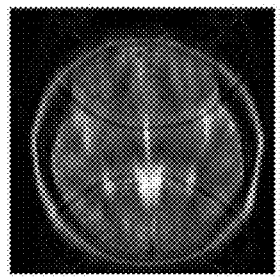
Figure 14B:
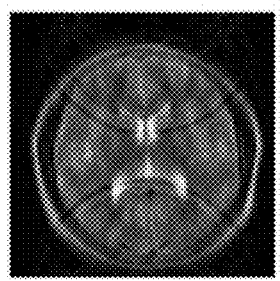
Figure 14B:
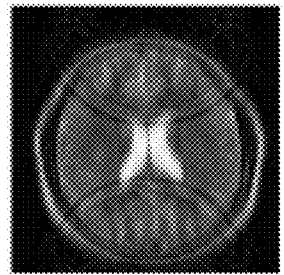
Figure 14B:
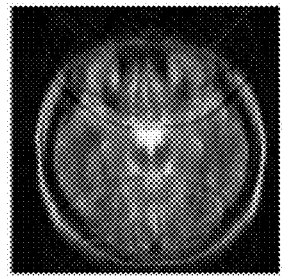
Figure 14C:
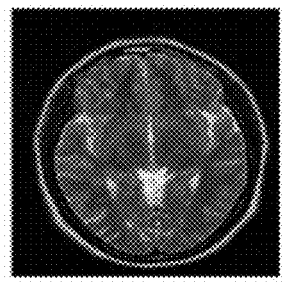
Figure 14C:
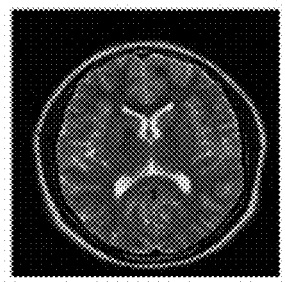
Figure 14C:
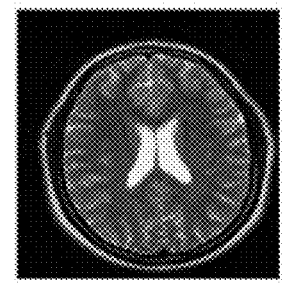
Figure 14C:
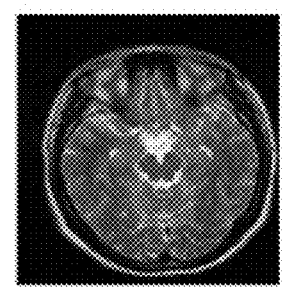

In FIG. 14, an image has 256×256 resolution, and images in FIG. 14A are MR images realized through full-sampling, images in FIG. 14B are MR images realized through conventional under-sampling, and images in FIG. 14C are MR images realized according to the exemplary embodiment of the present invention.

As shown in FIG. 14, the MR images of FIG. 14C provided according to the exemplary embodiment of the present invention have significantly improved image quality compared to the images of FIG. 14B and have image quality that is very close to that of the images of FIG. 14A.

With respect to a high-resolution image, the number of dimensions (the number of pixels) of input data is high and thus deep learning may not be possible. In order to solve such a dimensionality problem of input data, a deep learning method that utilizes wavelet pooling can be applied to the present invention. This method may be a method for applying dimensionality deduction of input data by using wavelet pooling and then reconstructing an MR image by performing deep learning on the dimension-reduced data. For example, the number of pixels of an MR image to be reconstructed is 512×512, and an MR image deformed from under-sampled data is a first MR image I. In this case, the first MR image I of 512×512 pixels is applied to a wavelet pooling operator $$\Phi = \begin{bmatrix} \Phi_1 \\ \vdots \\ \Phi_k \end{bmatrix} = \begin{bmatrix} \phi 1 *_2 \\ \vdots \\ \phi k *_2 \end{bmatrix},$$

and thus MR images $\Phi_1 I, \Phi_2 I, \ldots, \Phi_k I$ of dimension-reduced 256×256 pixels can be generated. Here, $\{\phi 1, \phi 2, \ldots, \phi k\}$ corresponds to a wavelet pooling filter, $*_2$ is a convolutional operator with stride of two, and $\Phi_j I = \phi j *_2 I$ ($1 \leq j \leq k$).

Thus, when a reconstruction operator corresponding thereto is $\tilde{\Phi}$, the following Equation 1 can be satisfied.

$$I = \tilde{\Phi}\Phi I = \sum_{j=1}^{k} \tilde{\phi}j *_1 U(\Phi_j I)$$ [Equation 1]

Here, $\{\tilde{\phi}1, \tilde{\phi}2, \ldots, \tilde{\phi}k\}$ corresponds to a dual filter of $\{\phi 1, \phi 2, \ldots, \phi k\}$, $*_1$ corresponds to a convolutional operator with one stride and U is an up-sampling operator.

According to another exemplary embodiment of the present invention, a plurality of MR images $\Phi_1 I, \Phi_2 I, \ldots, \Phi_k I$, of which dimensions are lower than dimensions of the under-sampled first MR image I, and a high-resolution MR image, can be provided by piecing together MR images that are reconstructed by applying deep learning to the plurality of MR images $\Phi_1 I, \Phi_2 I, \ldots, \Phi_k I$.

When a wavelet pooling operator applied to an input image and a filter thereof are respectively $\Phi$ and $\{\phi 1, \phi 2, \ldots, \phi k_1\}$, a reconstruction operator and a dual filter of a wavelet pooling operator $\psi$ applied to an output image are respectively $\tilde{\psi}$ and $\{\tilde{\psi}1, \tilde{\psi}2, \ldots, \tilde{\psi}k_2\}$, and applied deep learning is "U-net", a reconstruction process by using wavelet pooling and deep learning can be represented as given in Equation 2.

$$I \approx \tilde{\psi} Unet[\Phi(I)]$$ [Equation 2]

Figure 15:
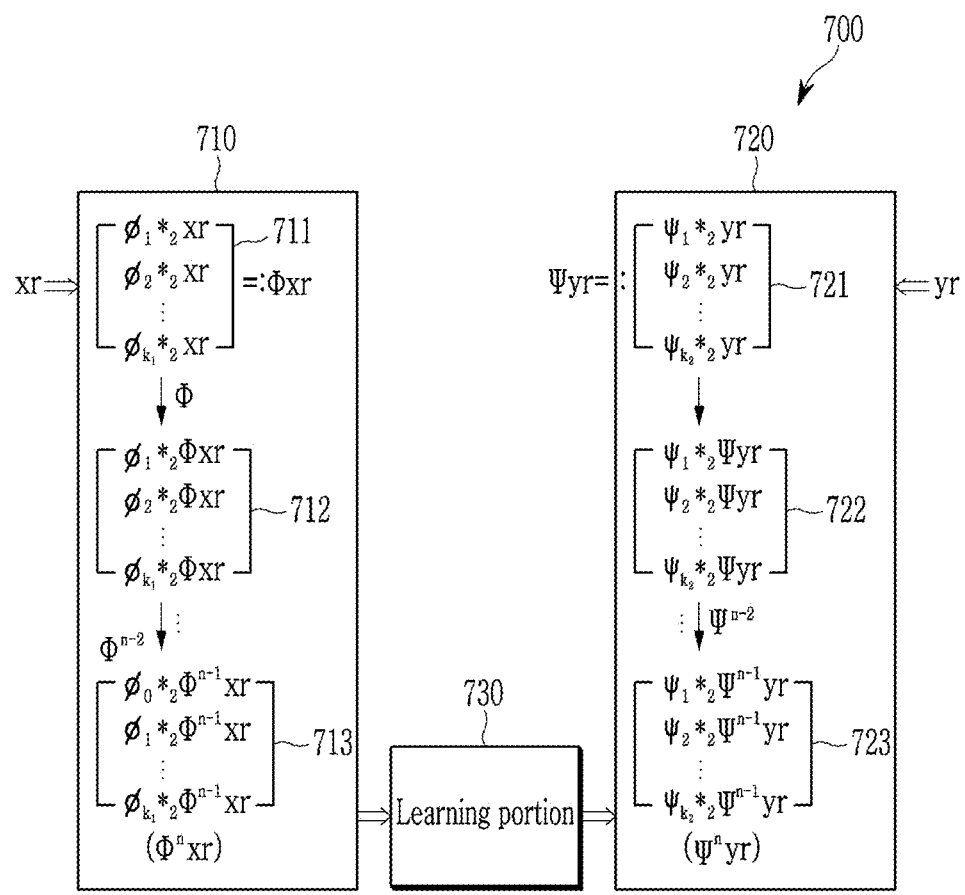
FIG. 15 shows a deep learning device according to another exemplary embodiment of the present invention.

FIG. 15 shows a deep learning device according to another exemplary embodiment of the present invention.

As shown in FIG. 15, a deep learning device 700 includes a first deposition portion 710 that decomposes an under-sampled reference high-resolution input image x, a second decomposition portion 720 that decomposes a full-sampled reference high-resolution label image y, and a learning portion 730. The high-resolution input image x is an image that includes a uniformly sampled image and an image at a low-frequency region.

The first decomposition portion 710 generates n×k1 reference low-resolution input images $\Phi^n x_r$ by repeating k1 filters $\{\phi 1, \phi 2, \ldots, \phi k_1\}$ n times on a reference high-resolution input image xr. The second decomposition portion 720 generates n×k2 reference low-resolution label images ψ″yr by repeating k2 filters {ψ1, ψ2, . . . , ψk₂} n times on a high-resolution label image yr.

The learning portion 730 learns a relationship between the n×k1 reference low-resolution input image Φ″x and the reference low-resolution label image ψ″yr through deep learning. The deep learning method may use the above-stated convolutional neural network.

In detail, when a high-resolution original image has resolution of $2^k \times 2^k$, the first decomposition portion 710 generates k1 $2^{K-1} \times 2^{k-1}$-resolution images 711 by using k1 filters {φ1, φ2, . . . , φk₁}. The first composition portion 710 generates 2×k1 $2^{K-2} \times 2^{k-2}$-resolution images 712 by using the k1 filter {φ1, φ2, . . . , φk₁} again. The first decomposition portion 710 iteratively performs the above-stated operation, and thus generates n×k1 reference low-resolution input images Φ″xr 713 by repeating k1 filters {φ1, φ2, . . . , k₁} n times.

Likewise, when a high-resolution label image has resolution of $2^k \times 2^k$, the second decomposition portion 720 generates k2 $2^{K-1} \times 2^{k-1}$-resolution images 721 by using k2 filters {ψ1, ψ2, . . . , ψk₂}. The second decomposition portion 720 generates 2×k2 $2^{K-2} \times 2^{k-2}$-resolution image 722 by using the k2 filters {ψ1, ψ2, . . . , ψk₂} again. The second decomposition portion 720 iteratively performs the above-stated operation, and thus generates n×k2 reference low-resolution label images ψ″yr 723 by repeating k2 filters {ψ1, ψ2, . . . , ψk₂} n times.

The learning portion 730 may include a neural network learning such that a result acquired through deep learning with respect to the reference low-resolution input image Φ″xr 713 becomes the reference low-resolution label image ψ″yr 723. In this case, the learning portion 730 may perform different deep learning on a corresponding reference low-resolution label image among n×k2 reference low-resolution label images Ψ″yr 723 according to n×k1 reference low-resolution input image Φ″xr 713. For example, the learning portion 730 may perform learning so that part of the n×k1 reference low-resolution input image Φ″xr 713 may correspond to a part of reference low-resolution label images among the n×k2 reference low-resolution label image Ψ″yr 723.

By using the learning portion 730 learned through such a process, a high-resolution input image can be reconstructed to an MR image.

Figure 16:
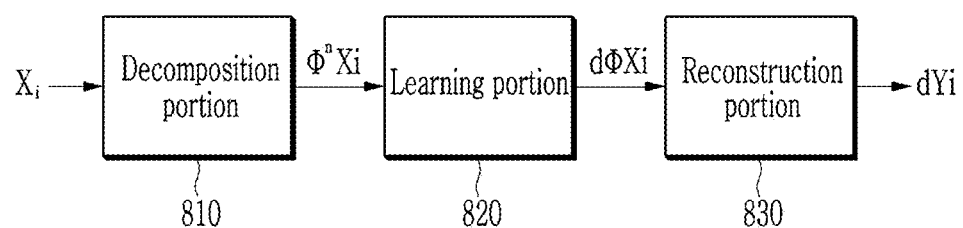
FIG. 16 shows an MR image reconstruction apparatus according to another exemplary embodiment of the present invention.

FIG. 16 shows an MR image reconstruction apparatus according to another exemplary embodiment of the present invention.

An MR image reconstruction apparatus 800 includes a decomposition portion 810, a learning portion 820, and a reconstruction portion 830.

With the same configuration of the first decomposition portion 710, the composition portion 810 generates a low-resolution input image Φˣ Xi by applying a plurality of filters {φ1, φ2, . . . , φk₁} times to a high-resolution input image Xi.

The learning portion 820 includes a deep learning neural network implemented by the learning portion 703 through learning. The learning portion 820 includes at least two deep learning neural networks, and is capable of applying a different deep learning neural network depending on a low-resolution input image Φ″Xi. The learning portion 820 generates a low-resolution output image Φ″Xi that approximates ψ″x by applying a deep learning neural network that corresponds to the resolution input image Φ″Xi. In this case, the deep learning neural network may be a convolutional neural network. In this case, ψ″x is a low-resolution image that is converted by applying filters {ψ1, ψ2, . . . , ψk₂} n times to the input image Xi.

The reconstruction portion 830 generates a reconstructed high-resolution output image dYi that approximates a high-resolution label image Yi that is generated by full-sampling that corresponds to the high-resolution input image Xi by repeating a convolution operation n times on the low-resolution output image dΦnXi output from the learning portion 820 by using dual filters {ψ̃1, ψ̃2, . . . , ψ̃k₂} of the filters {ψ1, ψ2, . . . , ψk₂} of the second decomposition portion 720. The high-resolution label image Yi is a full-sampled label image.

Figure 17:
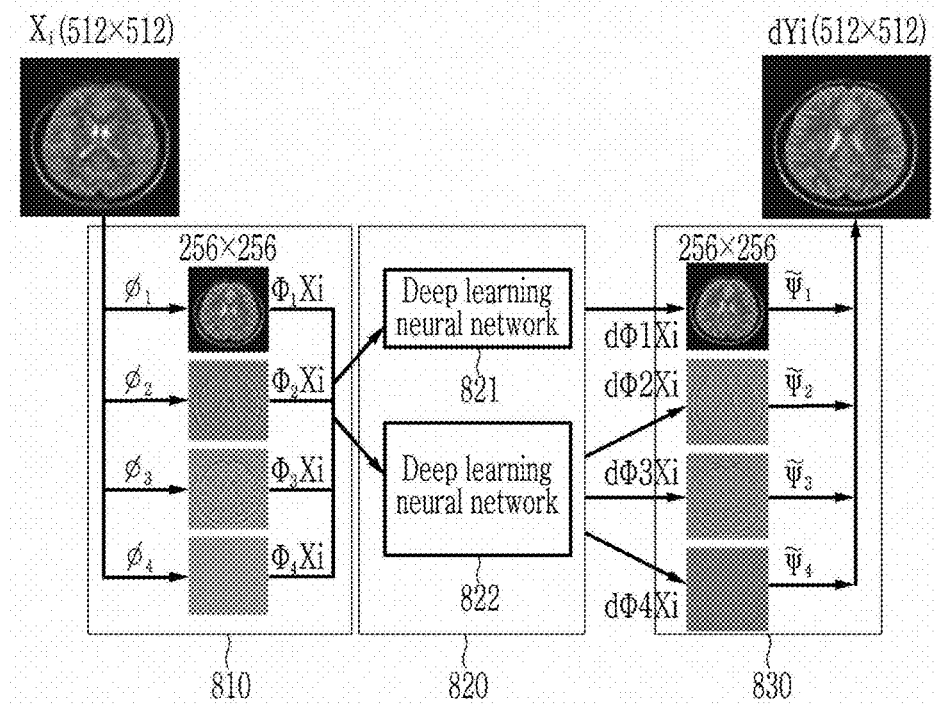
FIG. 17 exemplarily shows the MR image reconstruction apparatus according to the other exemplary embodiment of the present invention.

FIG. 17 exemplarily shows the MR image reconstruction apparatus according to the other exemplary embodiment of the present invention.

In FIG. 17, a high-resolution input image and a high-resolution label image have resolution of $512(=2^9) \times 512$, n is 1, and Φ and ψ are the same 2D Haar filters, wherein k1 and k2 are 4.

As shown in FIG. 17, the decomposition portion 810 generates low-resolution input images Φ₁Xi, Φ₂Xi, Φ₃Xi, and Φ₄Xi, each having resolution of $256(=2^8) \times 256$ by applying four filters {φ1, φ2, φ3, φ4} to the high resolution input image Xi.

The learning portion 820 includes two deep learning neural networks 821 and 821, generates a low-resolution output image dΦ1Xi that approximates Ψ₁Yi by inputting low-resolution input images Φ₁Xi, Φ₂Xi, Φ₃Xi, and Φ₄Xi to the deep learning neural network 821, and generates low-solution output images dΦ2Xi, dΦ3Xi, and dΦ4Xi that approximate Ψ₂Y, Ψ₃Yi, and Ψ₄Yi by inputting the low-resolution input images Φ₁Xi, Φ₂Xi, Φ₃Xi, and Φ₄Xi to the deep learning neural network 822. FIG. 17 is exemplarily provided for description of the present invention, and the present invention is not limited thereto.

The reconstruction portion 830 generates an output image dYi of high resolution of 512×512 generated by performing full-sampling with application of duel filters {Ψ̃1, Ψ̃2, Ψ̃3, Ψ̃4} to low-resolution output images dΦ1Xi, dΦ2Xi, dΦ3Xi, and dΦ4Xi.

The above-described technical contents may be implemented in the form of program instructions that can be executed through various computer means and may be recorded on a computer readable medium. The computer readable medium may include a program command, a data file, a data structure, or the like, or a combination thereof. The program command recorded in the computer readable medium may be specially designed and configured for an exemplary embodiment of the present invention, or may be known and used by a person skilled in a computer software field. A computer readable recording medium exemplarily includes magnetic media such as hard disks, floppy disks, and magnetic tapes; optical media such as compact disk-read only memory (CD-ROM) and digital versatile disks (DVDs); magneto-optical media such as floptical disks; and hardware devices such as read-only memory (ROM), random access memory (RAM), and flash memory, which are specially configured to store and execute program instructions. Examples of the program instructions include not only machine language codes created by a compiler or the like, but also high-level language codes that can be executed by a computer using an interpreter or the like. The above hardware devices may be configured to operate as one or more software modules to perform the processes of the present invention, and vice versa.

In the foregoing discussion, although the present disclosure has been described in connection with the specific matters, such as the specific components, the various embodiments, and the drawings, they are provided only for assisting in the understanding of the present disclosure, and the present disclosure is not limited to the embodiments. It will be apparent that those skilled in the art can make various modifications and changes thereto from these descriptions. Therefore, the spirit of the present disclosure should not be limited to the above-described embodiments, and the appended claims and what are modified equally or equivalently thereto will be considered to fall within the scopes of the present disclosure.

What is claimed is:

1. A magnetic resonance image reconstruction apparatus using learning, comprising:
   an under-sampling portion that performs full-sampling with respect to a first region that corresponds to a center of a first k-space image and performs under-sampling with respect to a second region in the first k-space image, excluding the first k-space image, to under-sample the first k-space image; and
   a magnetic resonance image reconstruction portion that outputs a magnetic resonance image based on the first k-space image through a pre-learned neural network, generates a third k-space image by correcting a second k-space image that is based on the output magnetic resonance image, based on the first k-space image with respect to a region that correspondings to the first k-space image in the second k-space, and acquires a magnetic resonance image based on the third k-space image.

2. The MR image reconstruction apparatus using machine learning of claim 1, wherein the MR image reconstruction portion comprises:
   a first image converter that acquires a first MR image by converting the first k-space image;
   a first image reconstruction portion that acquires a second MR image through the learned neural network by receiving the first MR image;
   a second image converter that acquires the second k-space image by converting the second MR image;
   a second image reconstruction portion that generates the third k-space image through correction that replaces a portion overlapping the first k-space image with the first k-space image in the second k-space image; and
   a third image converter that acquires a reconstructed MR image by converting the third k-space image.

3. The MR image reconstruction apparatus using machine learning of claim 2, wherein the first image converter and the third image converter use inverse Fourier transform, and the second image converter uses Fourier transform.

4. The MR image reconstruction apparatus of claim 1, wherein the first image reconstruction portion is pre-learned by using a reference MR image converted from a k-space image that corresponds to an MR image and in which full-sampling is performed on a center region of the k-space image and under-sampling is formed on a remaining region of the k-space image as an input value, and an MR image converted from a reference full-sample k-space image as a label.

5. The MR image reconstruction apparatus using machine learning of claim 1, wherein the first region is set to a region corresponding to 3% to 8% of a center of the first k-space image.

6. The MR image reconstruction apparatus using machine learning of claim 1, wherein the under-sampling performed on the second region performs encoding by selecting one per at least four lines.

7. The MR image reconstruction apparatus using machine learning of claim 1, further comprising a region setting portion that sets a region that corresponds to a center of the first k-space image as the first region, and a remaining region as the second region.

8. An MR image reconstruction apparatus using learning, comprising:
   a decomposition portion that generates n×k1 low-resolution input images by applying k1 first filters n times to a high-resolution input image;
   a learning portion that generates n×k2 low-resolution output images by applying a corresponding neural network according to the n×k1 low-resolution input image; and
   a reconstruction portion that generates a high-resolution output image by applying k2 second dual filters n times to the n×k2 low-resolution output image,
   wherein the high-resolution input image is generated by converting a k-space image where full-sampling is performed on a first region that corresponds to a center of the k-space image and under-sampling is performed on a second region in the k-space image, excluding the first region, and
   the k2 second dual filters are dual filters with respect to k2 second filters that generate a reference high-resolution label image for learning of the neural network as n×k2 low-resolution label images.

9. The MR image reconstruction apparatus using machine learning of claim 8, wherein the learning portion comprises a neural network is learned so that a result acquired by performing deep learning on n×k1 reference low-resolution input images that are generated by iteratively performing the k1 filters n times on a reference high-resolution input image, becomes n×k2 reference low-resolution label images, and
   the n×k2 reference low-resolution label images are generated by repeating the k2 filters n times on a high-resolution label image.

10. The MR image reconstruction apparatus using machine learning of claim 8, wherein the learning portion uses different neural networks for a first low-resolution input image among the k1 low-resolution input images and for a second low-resolution input image among the k1 low-resolution input images.

11. A MR image reconstruction method using learning, comprising:
    under-sampling a first k-space image by full-sampling a first region that corresponds to a center of the first k-space image and under-sampling a second region, excluding the first region, in the first k-space image;
    outputting an MR image based on the first k-space image through a pre-learned neural network;
    generating a third k-space image by correcting a second k-space image that is based on the output MR image, based on the first k-space image with respect to a region corresponding to the first k-space image in the second k-space image; and
    acquiring an MR image based on the third k-space image.

12. The MR image reconstruction method using machine learning of claim 11, wherein the outputting the MR image based on the first k-space image through the pre-learned neural network comprises:
    acquiring a first MR image by converting the first k-space image; and acquiring a second MR image through the learned neural network by receiving the first MR image.

13. The MR image reconstruction method using machine learning of claim 12, wherein the acquiring the first MR image comprises acquiring the first MR image by inverse Fourier transforming the first k-space image.

14. The MR image reconstruction method using machine learning of claim 11, wherein the generating the third k-space image comprises:
   acquiring the second k-space image by converting the output MR image; and
   generating the third k-space image through correction that replaces a portion overlapping the first k-space image with the first k-space image in the second k-space image.

15. The MR image reconstruction method using machine learning of claim 14, wherein the acquiring the second k-space image comprises acquiring the second k-space image by Fourier transforming the output MR image.

16. The MR image reconstruction method using machine learning of claim 11, wherein the pre-learned neural network is pre-learned by using a reference MR image converted from a k-space image that corresponds to an MR image and in which full-sampling is performed on a center region of the k-space image and under-sampling is formed on a remaining region of the k-space image as an input value, and an MR image converted from a reference full-sample k-space image as a label.

17. The MR image reconstruction method using machine learning of claim 11, further comprising setting a region corresponding to a center of the first k-space image as the first region and a remaining region as the second region.

18. An MR image reconstruction method using learning, comprising:
   generating a high-resolution input image by converting a k-space image where full-sampling is performed on a first region that corresponds to a center of the k-space image and under-sampling is performed on a second region in the k-space image, excluding the first region;
   decomposing for generating n×k1 low-resolution input images by applying k1 first filters on the high-resolution input image;
   generating n×k2 low-resolution output images by applying a corresponding neural network according to the n×k1 low-resolution input images; and
   generating a high-resolution output image by applying nk2 second dual filters to the n×k2 low-resolution output images,
   wherein the k2 second dual filters are dual filters with respect to k2 second filters that generate a reference high-resolution label image for learning of the neural network as n×k2 low-resolution label images.

19. The MR image reconstruction method using mahine learning of claim 18, wherein the neural network is learned so that a result acquired by performing deep learning on n×k1 reference low-resolution input images that are generated by iteratively performing the k1 filters n times on a reference high-resolution input image, becomes n×k2 reference low-resolution label images, and
   the n×k2 reference low-resolution label images are generated by repeating the k2 filters n times on a high-resolution label image.

20. The MR image reconstruction method using machine learning of claim 18, wherein the generating the n×k2 low-resolution output images comprises:
   applying a first neural network that corresponds to a first low-resolution input image among the n×k1 low-resolution input images; and
   applying a second neural network that corresponds to a second low-resolution input image among the n×k1 low-resolution input images.

21. A computer readable recording medium on which a program that executes an MR image reconstruction method of claim 11 is recorded.

* * * * *